US012672384B2

(12) United States Patent
Gordon et al.

(10) Patent No.: US 12,672,384 B2
(45) Date of Patent: Jun. 30, 2026

(54) COMPACT CONCENTRATOR FOR MICROSCALE SPACE PHOTOVOLTAIC SYSTEMS

(71) Applicants: The Penn State Research Foundation, University Park, PA (US); B.G. Negev Technologies and Applications Ltd., at Ben-Gurion University, Beer-Sheve (IL)

(72) Inventors: Jeffrey Gordon, Midreshet Ben-Gurion (IL); Christian Ruud, State College, PA (US); Noel C. Giebink, State College, PA (US)

(73) Assignees: THE PENN STATE RESEARCH FOUNDATION, University Park, PA (US); B.G. NEGEV TECHNOLOGIES AND APPLICATIONS LTD., AT BEN-GURION UNIVERSITY, Beer-Sheve (IL)

( * ) Notice: Subject to any disclaimer, the term of this patent is extended or adjusted under 35 U.S.C. 154(b) by 125 days.

(21) Appl. No.: 18/841,578

(22) PCT Filed: Jun. 21, 2022

(86) PCT No.: PCT/US2022/034326
§ 371 (c)(1),
(2) Date: Aug. 26, 2024

(87) PCT Pub. No.: WO2024/172805
PCT Pub. Date: Aug. 22, 2024

(65) Prior Publication Data
US 2025/0185412 A1    Jun. 5, 2025

Related U.S. Application Data

(60) Provisional application No. 63/212,830, filed on Jun. 21, 2021.

(51) Int. Cl.
*H10F 77/42* (2025.01)
(52) U.S. Cl.
CPC ......... *H10F 77/488* (2025.01); *H10F 77/484* (2025.01)
(58) Field of Classification Search
None
See application file for complete search history.

(56) References Cited

U.S. PATENT DOCUMENTS

2006/0191566 A1    8/2006  Schaafsma
2006/0193066 A1    8/2006  Prueitt
(Continued)

OTHER PUBLICATIONS

Ruud et al. Design and demonstration of ultra-compact microcell concentrating photovoltaics for space. Optics Express 27(20), 2019. [retrieved on Jul. 29, 2024]. Retrieved from the Internet. <URL: https://opg. optica.org/OE/abstract.cfm?uri=OE-27-20-a1467>.
(Continued)

*Primary Examiner* — Mayla Gonzalez Ramos
(74) *Attorney, Agent, or Firm* — Troutman Pepper Locke LLP

(57) ABSTRACT

An exemplary' embodiment of the present disclosure provides a device for concentrating light and methods of making and using such device. The device comprising a substantially cone-shaped optical body comprising a first side and an opposing second side extending along a central axis, the second side larger than the first side, a receiver positioned near the first side of the optical body and oriented towards the second side, and a reflector proximate the second side of the optical body, wherein a cross section of the reflector about the central axis comprises at least two substantially parabolic curves extending along a length of the second side of the optical body and converging at the central axis.

23 Claims, 11 Drawing Sheets

(56) References Cited

U.S. PATENT DOCUMENTS

| | | |
|---|---|---|
| 2012/0026746 A1 | 2/2012 | Schug |
| 2017/0054408 A1 | 2/2017 | Lakshmanan et al. |
| 2018/0067292 A1* | 3/2018 | Noble ................ G02B 19/0028 |

OTHER PUBLICATIONS

International Search Report and Written Opinion mailed Aug. 16, 2024 in corresponding International Patent Application No. PCT/US2022/034326.

\* cited by examiner

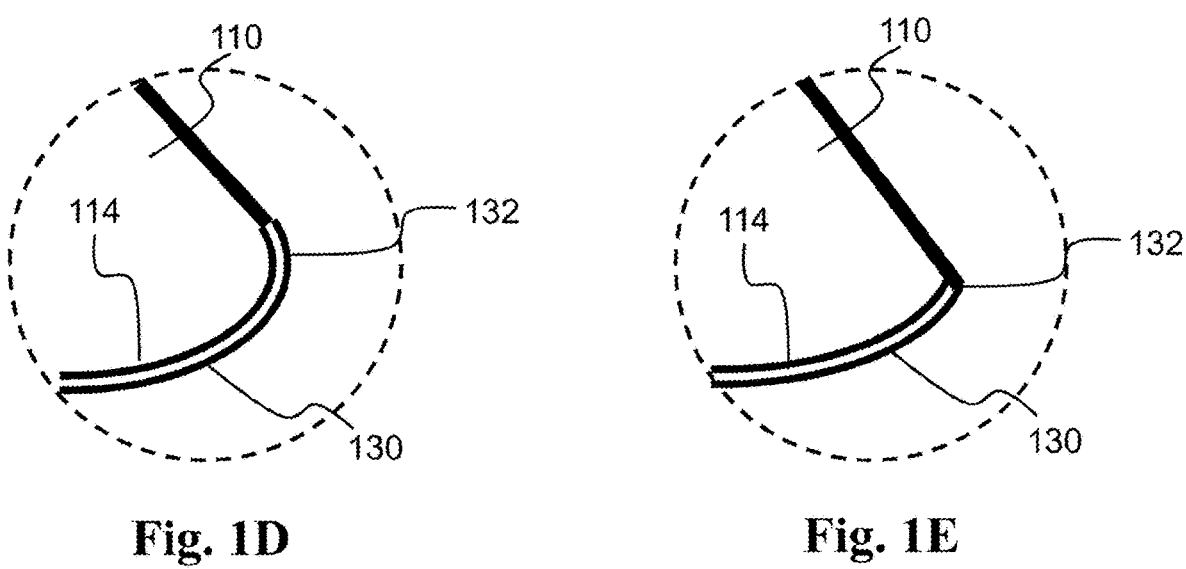
Fig. 1D          Fig. 1E
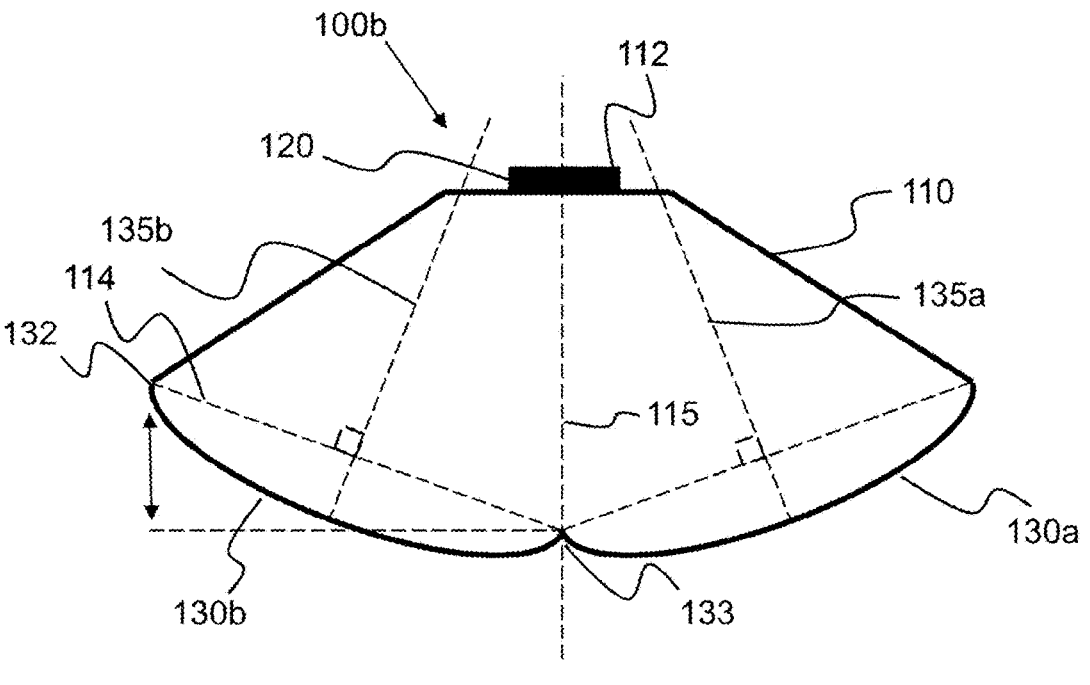
Fig. 2A

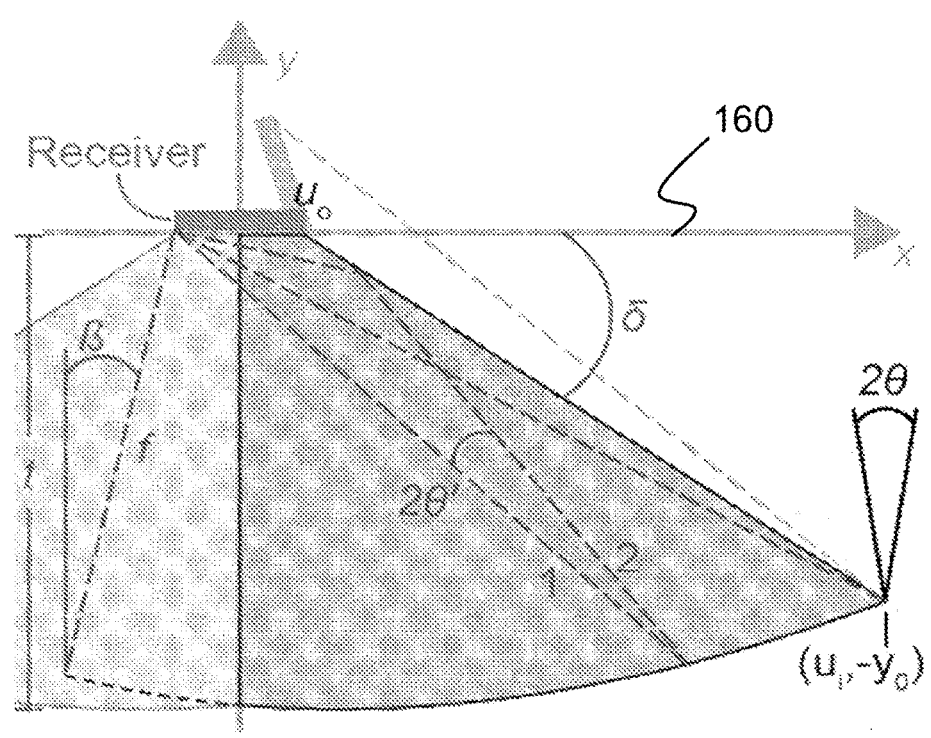
Fig. 2D
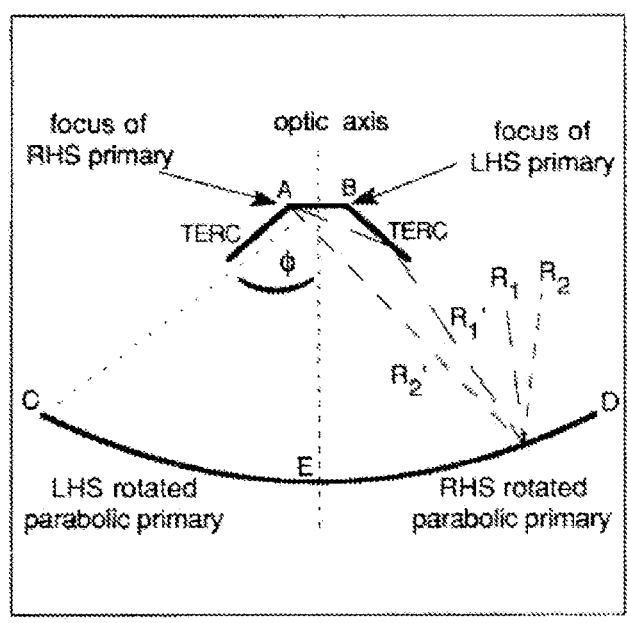
Fig. 2E (*Prior Art*)

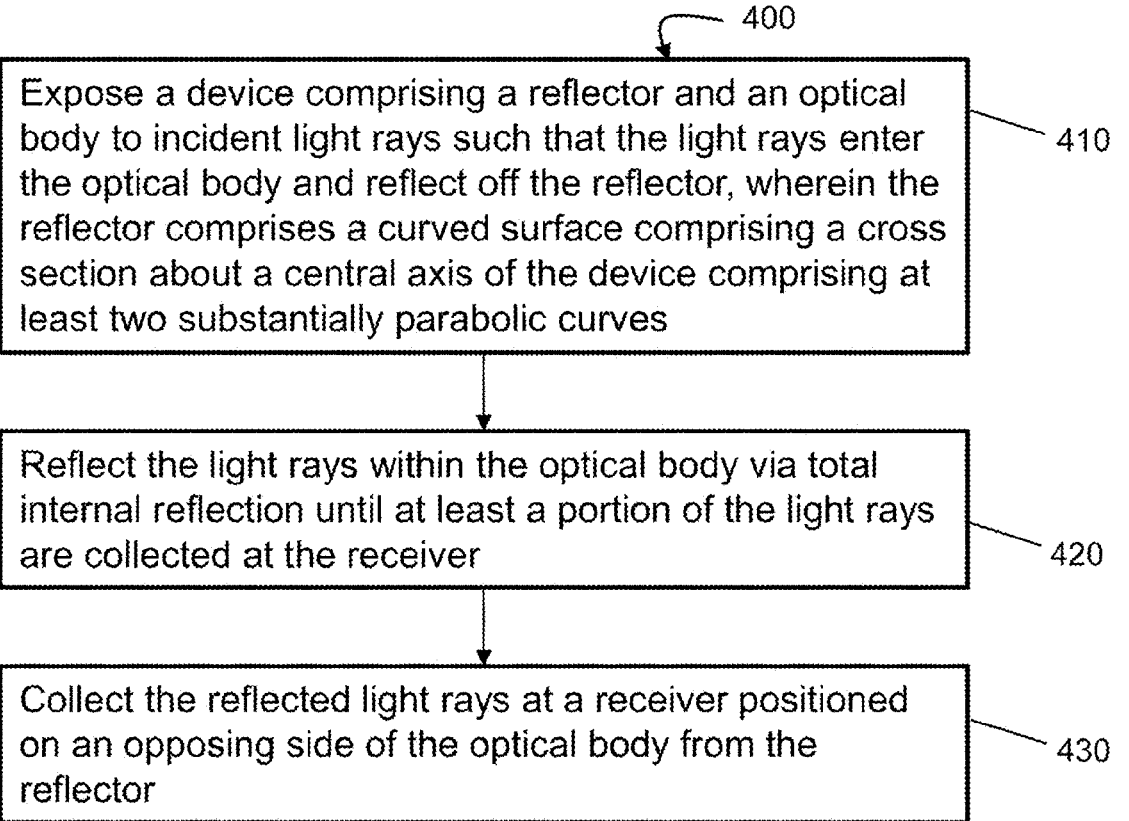

400

Expose a device comprising a reflector and an optical body to incident light rays such that the light rays enter the optical body and reflect off the reflector, wherein the reflector comprises a curved surface comprising a cross section about a central axis of the device comprising at least two substantially parabolic curves

410

Reflect the light rays within the optical body via total internal reflection until at least a portion of the light rays are collected at the receiver

420

Collect the reflected light rays at a receiver positioned on an opposing side of the optical body from the reflector

COMPACT CONCENTRATOR FOR MICROSCALE SPACE PHOTOVOLTAIC SYSTEMS

CROSS-REFERENCE TO RELATED APPLICATIONS

This application is a national phase filing under 35 U.S.C. § 371 of International Patent Application No. PCT/US2022/034326, filed on Jun. 21, 2022, which claims the benefit of U.S. Provisional Patent Application Ser. No. 63/212,830, filed on Jun. 21, 2021, each of which is incorporated herein by reference in its entirety as if fully set forth below.

FEDERALLY SPONSORED RESEARCH STATEMENT

This invention was made with government support under Grant No. FA9453-17-C-0421 awarded by the United States Air Force, under Grant No. DE-AR0000626 awarded by the Department of Energy/ARPA-E and under Grant No. 80NSSC20K1206 awarded by the National Aeronautics & Space Administration (NASA). The government has certain rights in the invention.

FIELD OF THE DISCLOSURE

The various embodiments of the present disclosure relate generally to optical solar concentrators, and more particularly to systems and methods that improve various properties of optical solar concentrators.

BACKGROUND

Solar cells are one of the main sources of electrical power for space vehicles and are desired to be as efficient, compact, lightweight and reliable as possible. As space becomes increasingly commercialized, the demand for lower cost and higher performance photovoltaic power is growing, which has led to an interest in using inexpensive optics to concentrate light onto small area solar cells, so-called microconcentrating photovoltaics (uCPV).

Current optical solar concentrators have been extensively optimized for terrestrial use. However, the requirements for terrestrial solar concentrators and extraterrestrial solar concentrators are fundamentally different. Extraterrestrial solar concentrators, especially those for use in Low Intensity, Low Temperature (LILT) conditions, require high concentration ratios, optical efficiencies, and low mass compared to their terrestrial counterparts. It is also important that the acceptance half-angle of an extraterrestrial solar concentrator be sufficiently large to allow for power generation despite sun pointing errors, structural vibrations, and thermal distortions on the solar wing.

Therefore, there is a need for enhanced optical concentrator design for uCPV that can increase the performance of photovoltaic power while maintaining low mass, size and cost.

BRIEF SUMMARY

The present disclosure relates to systems and methods of making compact concentrators for microscale photovoltaic systems. An exemplary embodiment of the present disclosure provides a device for concentrating light which can include a substantially cone-shaped optical body with a first side and a larger opposing second side extending along a central axis, a receiver positioned near the first side of the optical body and oriented towards the second side, and a reflector proximate the second side of the optical body, wherein a cross section of the reflector about the central axis can include at least two substantially parabolic curves extending along a length of the second side of the optical body and converging at the central axis. The receiver of the device can include a photovoltaic cell that is optically bonded to at least a portion of the first side of the optical body. The second side of the optical body can include a curved surface. The reflector be configured with a first parabolic curve and a second parabolic curve, wherein each respective parabolic curve of the reflector is symmetric about a respective internal axis.

In some embodiments, the peripheral edges of the respective parabolic curve of the reflector can be positioned at an approximately uniform height from a central point of the parabolic curve such that the internal axis of each respective parabolic curve of the reflector is parallel to the central axis. The peripheral edges of the respective parabolic curve of the reflector can be positioned at an increased height from a central point of the parabolic curve such that the internal axis of each respective parabolic curve of the reflector is directed towards the receiver. In some embodiments, the peripheral edges of the respective parabolic curve of the reflector is positioned at a decreased height from a central point of the parabolic curve such that the internal axis of each respective parabolic curve of the reflector is directed away from the receiver. Alternatively or in addition to these embodiments, each parabolic curve can be tilted by an angle with respect to the central axis that satisfies the following equation:

$$\beta = \delta - \sin^{-1}\left(\frac{1}{n}\sin(\delta - \theta)\right)$$

wherein β is the angle with respect to the central axis, δ is an angle with respect to a plane of the first side to the optical body, n is a refractive index of the optical body, and θ is an acceptance half-angle.

In some embodiments, the second side of the optical body can include a rounded edge where the optical body joins with the reflector. The curved surface on the second side of the optical body can abut the reflector. A periphery formed at an edge of the second side of the optical body can abut the reflector. The reflector can be formed by coating the curved surface of the second side of the optical body with a reflective material, which may include one or more of: silver, aluminum, gold, nickel, copper, magnesium fluoride, silicon dioxide, tantalum pentoxide, zinc sulfide, titanium dioxide, glass, sapphire, polymer, or combinations thereof.

In some embodiments, the second side can be 3 or more times larger than the first side. The optical body can be constructed of a material comprising a refractive index equal to or greater than about 1.3 and can also include a dielectric material. The optical body can include glass, quartz, sapphire, polymer, or combinations thereof. The optical body can include a dimension from the first side to the second side equal to or less than 1 cm. The device can be configured to achieve a total internal reflection of light rays within the optical body. The device can be configured to achieve an optical efficiency of at least 37%. The device can be configured to achieve at least 37% power conversion efficiency with a concentration ratio greater than approximately 110 and an acceptance half-angle greater than approximately 5 degrees. The device can be configured to decrease light rejection losses by at least 35% compared to a comparative device having a reflector comprising only one parabolic curve.

In some embodiments, a device for concentrating light can include an optical element with a first side and an opposing second side, defining an internal volume of the optical element, a photovoltaic cell positioned on the first side of the optical element, and a reflector positioned on the second side of the optical element. The optical element can be configured to refract focused light within the internal volume to the photovoltaic cell, and the reflector can include two curved surfaces with each respective curved surface extending along a length of the second side of the optical element and converges at a central axis of the device. The two curved surfaces of the reflector can be tilted by an angle with respect to the central axis in such a way that the reflector reflects the focused light to the photovoltaic cell, and wherein the angle of tilt satisfies the following equation:

$$\beta = \delta - \sin^{-1}\left(\frac{1}{n}\sin(\delta - \theta)\right),$$

wherein $\beta$ is the angle, $\delta$ is an angle with respect to a plane of the first side to the optical body, n is a refractive index of the optical element, and $\theta$ is an acceptance half-angle.

In some embodiments, a device for collimating light can include a substantially cone-shaped optical body with a first side and a larger opposing second side extending along a central axis, a light source positioned near the first side of the optical body and oriented towards the second side, and a reflector proximate the second side of the optical body, wherein a cross section of the reflector about the central axis can include at least two substantially parabolic curves extending along a length of the second side of the optical body and converging at the central axis. The light source can include a light emitting diode that covers at least a portion of the first side of the optical body. The reflector can include a first parabolic curve and a second parabolic curve, wherein each parabolic curve of the reflector is symmetric about a respective internal axis. In some embodiments, a peripheral edge of the respective parabolic curve of the reflector can be positioned at an approximately uniform height from a central point of the parabolic curve such that the internal axis of each respective parabolic curve of the reflector is parallel to the central axis. In some embodiments, a peripheral edge of the respective parabolic curve of the reflector can be positioned at an increased height from a central point of the parabolic curve such that the internal axis of each respective parabolic curve of the reflector is directed towards the light source. In some embodiments, a peripheral edge of the respective parabolic curve of the reflector can be positioned at a decreased height from a central point of the parabolic curve such that the internal axis of each respective parabolic curve of the reflector is directed away from the light source. In these embodiments and/or further embodiments, the two curves of the reflector are tilted by an angle with respect to the central axis in such a way that the reflector reflects light rays from the light source, and wherein the angle of tilt satisfies the following equation:

$$\beta = \delta - \sin^{-1}\left(\frac{1}{n}\sin(\delta - \theta)\right),$$

wherein $\beta$ is the angle, $\delta$ is an angle with respect to a plane of the first side to the optical body, n is a refractive index of the optical body, and $\theta$ is an acceptance half angle.

In some embodiments, the second side can include a rounded edge where the optical body joins with the reflector. A curved surface on the second side of the optical body can abut the reflector. A periphery formed at an edge of the second side of the optical body can abut the reflector. The reflector can be formed by coating a curved surface of the second side with a reflective material, which can include one or more of: silver, aluminum, gold, nickel, copper, magnesium fluoride, silicon dioxide, tantalum pentoxide, zinc sulfide, titanium dioxide, glass, sapphire, polymer, or combinations thereof. The second side can be 10 or more times larger than the first side. The optical body is constructed of a material comprising a refractive index equal to or great than about 1.3 and can also include a dielectric material. The optical body can include glass, quartz, sapphire, polymer, or combinations thereof. The optical body can include a dimension from the first side to the second side equal to or less than 1 cm.

In some embodiments, a method of concentrating light can include exposing a device that can include a reflector and an optical body to incident light rays such that the light rays enter the optical body and reflect off the reflector, which can include a curved surface comprising a cross section about a central axis of the device comprising at least two substantially parabolic curves, and collecting the reflected light rays at a receiver positioned on an opposing side of the optical body from the reflector. The receiver can include a photovoltaic cell that covers at least a portion of a first side of the optical body. Another step of the method can include reflecting the light rays within the optical body via total internal reflection until at least a portion of the light rays are collected at the receiver.

In some embodiments, the reflector can include a first parabolic curve and a second parabolic curve, wherein each respective parabolic curve of the reflector is symmetric about a respective internal axis. The two curves of the reflector can be tilted by an angle with respect to the central axis in such a way that the reflector reflects the light rays to the receiver, and wherein the angle of tilt satisfies the following equation:

$$\beta = \delta - \sin^{-1}\left(\frac{1}{n}\sin(\delta - \theta)\right),$$

wherein $\beta$ is the angle, $\delta$ is an angle with respect to a plane of the first side to the optical body, n is a refractive index of the optical body, and $\theta$ is an acceptance half-angle, such that the light rays in the optical body are subject to total internal reflection. The method can also include filling the optical body with a dielectric material, and/or glass, quartz, sapphire, polymer, and any combination thereof. The method can include coating the opposing side with a reflective material.

In some embodiments, a method of making a device for concentrating light, the method comprising, aligning a receiver normal to a central axis on a first side of an optical body; positioning a reflector proximal to an opposing second side of the optical body, wherein the second side of the optical body can include a curved surface having a cross section comprising a plurality of substantially parabolic curves extending along a length of the second side of the optical body and converging at the central axis. The method can include filling the optical body with a dielectric material, and/or a material comprising a refractive index equal to or great than about 1.3. Positioning the reflector proximal to the second side of the optical body can include coating the second side of the optical body with the reflector. Positioning the reflector proximal to the second side of the optical body can also include adjoining, with a rounded connection, a peripheral edge of the second side with the reflector. The curved surface of the optical body can include a first parabolic curve and a second parabolic curve, wherein each respective parabolic curve is symmetric about a respective internal axis. The method can also include the step of aligning each parabolic curve at a right angle such that a peripheral edge of the respective parabolic curve of the reflector is positioned at an approximately uniform height from a central point of the parabolic curve and the internal axis of each respective parabolic curve is parallel to the central axis. Alternatively, the method can include tilting each parabolic curve at an angle such that a peripheral edge of the respective parabolic curve of the reflector is positioned at an increased height from a central point of the parabolic curve and the internal axis of each respective parabolic curve is directed towards the receiver. Another embodiment of the method can include tilting each parabolic curve at an angle such that a peripheral edge of the respective parabolic curve of the reflector is positioned at a decreased height from a central point of the parabolic curve and the internal axis of each respective parabolic curve is directed away from the receiver. Alternatively or additionally, the method can include tilting each parabolic curve at an angle that satisfies the following equation:

$$\beta = \delta - \sin^{-1}\left(\frac{1}{n}\sin(\delta - \theta)\right),$$

wherein $\beta$ is the angle, $\delta$ is an angle with respect to a plane of the first side to the optical body, n is a refractive index of the optical body, and $\theta$ is an acceptance half-angle. The method can include achieving a total internal reflection of light rays within the optical body. The method can include achieving an optical efficiency of at least 37%. The method can include achieving at least 37% power conversion efficiency with a concentration ratio greater than approximately 110 and an acceptance half-angle greater than approximately 5 degrees. The method can include decreasing light rejection losses by at least 35% compared to a comparative device having a reflector comprising only one parabolic curve.

In some embodiments, a device for concentrating light can include a substantially cone-shaped optical body with a first side and a larger opposing second side extending along a central axis, a photovoltaic cell positioned near the first side of the optical body and oriented towards the second side, and a Fresnel reflector proximate the second side of the optical body. The Fresnel reflector can be configured to reflect light towards the photovoltaic cell. The Fresnel reflector can be formed by coating a surface of the second side with a reflective material, and the surface of the second side can include a plurality of angled faces. Each of the plurality of angled faces can be tilted by an angle with respect to the central axis that satisfies the following equation:

$$\alpha = 90° + \sin^{-1}\left(\frac{1}{n}(\delta - \theta)\right) - \left[\delta + \tan^{-1}\left(\frac{A}{\frac{1}{G} + \frac{X}{Ui}}\right)\right],$$

wherein $\alpha$ is the tilt angle, $\delta$ is an angle with respect to a plane of the first side to the optical body, n is a refractive index of the optical body, $\theta$ is an acceptance half-angle, A is an aspect ratio of the optical body equal to a length of the optical body from the first side to the second side and divided by a width of the second side of the optical body, G is a geometric gain of the optical body equal to the width of the first side of the optical body divided by the width of the second side of the optical body, Ui is half the width of the first side of the optical body, and X is a distance from the central axis to a center of each respective angled face. The reflective material can include one or more of: silver, aluminum, gold, nickel, copper, magnesium fluoride, silicon dioxide, tantalum pentoxide, zinc sulfide, titanium dioxide, glass, sapphire, polymer, or combinations thereof.

These and other aspects of the present disclosure are described in the Detailed Description below and the accompanying drawings. Other aspects and features of embodiments will become apparent to those of ordinary skill in the art upon reviewing the following description of specific, exemplary embodiments in concert with the drawings. While features of the present disclosure may be discussed relative to certain embodiments and figures, all embodiments of the present disclosure can include one or more of the features discussed herein. Further, while one or more embodiments may be discussed as having certain advantageous features, one or more of such features may also be used with the various embodiments discussed herein. In similar fashion, while exemplary embodiments may be discussed below as device, system, or method embodiments, it is to be understood that such exemplary embodiments can be implemented in various devices, systems, and methods of the present disclosure.

BRIEF DESCRIPTION OF THE DRAWINGS

The following detailed description of specific embodiments of the disclosure will be better understood when read in conjunction with the appended drawings. For the purpose of illustrating the disclosure, specific embodiments are shown in the drawings. It should be understood, however, that the disclosure is not limited to the precise arrangements and instrumentalities of the embodiments shown in the drawings.

FIG. 1D provides an enlarged detail view taken from FIG. 1A, in accordance with an exemplary embodiment of the present invention.

FIG. 1E provides an enlarged detail view taken from FIG. 1A, in accordance with an exemplary embodiment of the present invention.

FIG. 2A provides a cross-sectional view of a device for concentrating light, in accordance with an exemplary embodiment of the present invention.

FIG. 2D provides the angles and reference points used in some of the equations herein overlayed on a cross-sectional view of a device for concentrating light, in accordance with an exemplary embodiment of the present invention.

FIG. 2E provides an example device of a known concentrator.

FIG. 4 provides a flow chart of a method of using a device for concentrating light, in accordance with an exemplary embodiment of the present invention.

DETAILED DESCRIPTION

Figures 1A, 1B, 1C:
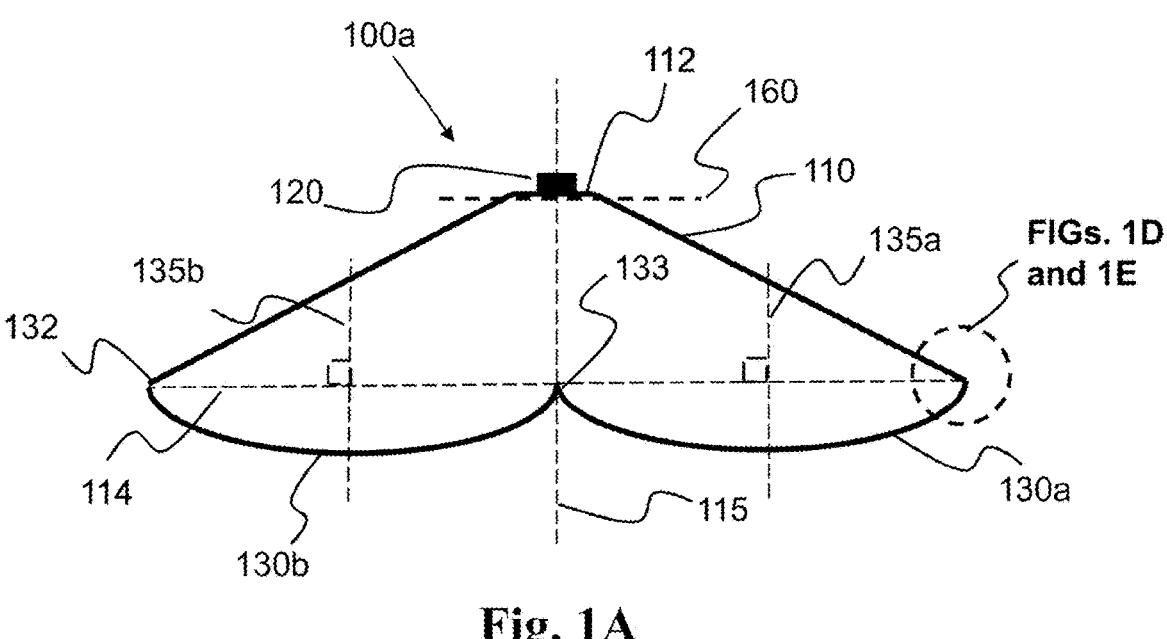
FIG. 1A provides a cross-sectional view of a device for concentrating light, in accordance with an exemplary embodiment of the present invention.
FIG. 1B provides a top view of a device for concentrating light, in accordance with an exemplary embodiment of the present invention.
FIG. 1C provides a perspective side-view of a device for concentrating light, in accordance with an exemplary embodiment of the present invention.

To facilitate an understanding of the principles and features of the present disclosure, various illustrative embodiments are explained below. The components, steps, and materials described hereinafter as making up various elements of the embodiments disclosed herein are intended to be illustrative and not restrictive. Many suitable components, steps, and materials that would perform the same or similar functions as the components, steps, and materials described herein are intended to be embraced within the scope of the disclosure. Such other components, steps, and materials not described herein can include, but are not limited to, similar components or steps that are developed after development of the embodiments disclosed herein.

It must be noted that, as used in the specification and the appended claims, the singular forms "a," "an" and "the" include plural references unless the context clearly dictates otherwise. For example, reference to a component is intended also to include composition of a plurality of components. References to a composition containing "a" constituent is intended to include other constituents in addition to the one named. In other words, the terms a, an, and the do not denote a limitation of quantity, but rather denote the presence of at least one of the referenced item.

As used herein, the term "and/or" may mean "and," it may mean "or," it may mean exclusive-or," it may mean "one," it may mean "some, but not all," it may mean "neither," and/or it may mean "both." The term "or" is intended to mean an inclusive "or."

Also, in describing the exemplary embodiments, terminology will be resorted to for the sake of clarity. It is intended that each term contemplates its broadest meaning as understood by those skilled in the art and includes all technical equivalents which operate in a similar manner to accomplish a similar purpose. It is to be understood that embodiments of the disclosed technology may be practiced without these specific details. In other instances, well-known methods, structures, and techniques have not been shown in detail in order not to obscure an understanding of this description. References to "one embodiment," "an embodiment," "example embodiment," "some embodiments," "certain embodiments," "various embodiments," etc., indicate that the embodiment(s) of the disclosed technology so described may include a particular feature, structure, or characteristic, but not every embodiment necessarily includes the particular feature, structure, or characteristic. Further, repeated use of the phrase "in one embodiment" does not necessarily refer to the same embodiment, although it may.

Ranges may be expressed herein as from "about" or "approximately" or "substantially" one particular value and/ or to "about" or "approximately" or "substantially" another particular value. When such a range is expressed, other exemplary embodiments include from the one particular value and/or to the other particular value. Further, the term "about" means within an acceptable error range for the particular value as determined by one of ordinary skill in the art, which will depend in part on how the value is measured or determined, i.e., the limitations of the measurement system. For example, "about" can mean within an acceptable standard deviation, per the practice in the art. Alternatively, "about" can mean a range of up to ±20%, preferably up to ±10%, more preferably up to ±5%, and more preferably still up to ±1% of a given value. Alternatively, the term can mean within an order of magnitude, preferably within 2-fold, of a value. Where particular values are described in the application and claims, unless otherwise stated, the term "about" is implicit and in this context means within an acceptable error range for the particular value.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Similarly, as used herein, "substantially free" of something, or "substantially pure", and like characterizations, can include both being "at least substantially free" of something, or "at least substantially pure", and being "completely free" of something, or "completely pure.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

Aspects of the disclosed technology improve various properties of micro-sized optical solar concentrators and/or collimators. For instance, enhanced properties include the optical concentration, optical or angular tolerance and/or specific power that can be achieved at a given acceptance angle for lightweight concentrating photovoltaic systems deployed on satellites and space probes. Typical requirements addressing these properties can include, but are not limited to material compositions, physical dimensions of optical elements, optical surfaces, material imperfections for optics, and optical assembly. As can be appreciated by one of skill in the art, increased optical concentration, optical tolerance, and specific power while maintaining a low size and mass can broaden the applications of such a microconcentrator for solar powered space missions.

As shown in FIG. 1A, an exemplary embodiment of the present invention provides a device 100a for concentrating light. The light concentrated can be incident photons from the sun or other forms of light such as from an LED or laser. Notably, device 100a is configured to concentrate light from light sources of small, but non-negligible angular extent. Light sources that emit over a large angular range, such as, for instance, incandescent light bulbs, fluorescent light bulbs, neon light bulbs, and the like can be more useful in a reverse mode of device 100a, as described in more detail with reference to FIGS. 9A-9C.

Device 100a can include an optical body 110, a receiver 120, and a reflector 130. Although shown as a 2-dimensional cross-sectional view from a side perspective in FIG. 1A, example 3-dimensional perspective views from the top and from the side are provided in FIGS. 1B and 1C, respectively.

In some embodiments, the size of device 100a can range from sub-millimeter up to several millimeters. In particular, the entry aperture of light (from anywhere on optical body 110 that is not shaded by receiver 120 or reflector 130) will be larger, in linear dimension, by a factor of the square root of the geometric concentration ratio.

Referring back to FIG. 1A, optical body 110 of device 100a can be substantially cone-shaped and symmetric about a central axis 115 of device 100a. The cross-sectional shape of optical body 110 can also include pyramidal, trapezoidal, and the like. Optical body 110 can include a first side 112 and an opposing second side 114 defining an internal volume of optical body 110. Although not wishing to be bound by such examples, the first side 112 can be a top side of device 100a and the second side 114 can be a bottom side of device 100a, as depicted in FIG. 1A. First side 112 and second side 114 can extend along a central axis 115 such that the central axis 115 intercepts with an approximately central point on first side 112 and an approximately central point on the second side 114. In some embodiments, second side 114 can be larger than first side 112. For instance, first side 112 can include a dimension ranging from about 0.01 mm to about 0.5 mm (e.g., from about 0.01 mm to about 0.05 mm from about 0.05 mm to about 0.1 mm, about 0.15 mm to about 0.2 mm, about 0.25 mm to about 0.3 mm, about 0.35 mm to about 0.4 mm, about 0.45 mm to about 0.5 mm, or any value between, e.g., 0.172 mm or 0.421 mm). In addition, second side 114 can be about 3 or more times larger than first side 112 and can include a dimension ranging from about 0.15 mm to about 0.85 mm (e.g., from about 0.15 mm to about 0.2 mm, about 0.25 mm to about 0.3 mm, about 0.35 mm to about 0.4 mm, about 0.45 mm to about 0.5 mm, about 0.55 mm to about 0.6 mm, about 0.65 mm to about 0.7 mm, about 0.75 mm to about 0.8 mm, about 0.85 mm, about 0.85 mm to about 0.9 mm, about 0.95 mm to about 1 mm, about 1 mm to about 1.1 mm, about 1.1 mm to about 1.2 mm, about 1.2 mm to about 1.3 mm, about 1.3 mm to about 1.4 mm, or any value between, e.g., 0.22 mm or 0.781 mm).

In certain examples, the internal volume of optical body 110 can be substantially solid, such that optical body 110 is a solid structure between first side 112 and second side 114. In some embodiments, the internal volume of optical body 110 can include a vacant space such that optical body 110 is composed of a material forming the border of the structure with a different material filling the internal volume of optical body 110. For instance, optical body 110 can include a quartz border that can be filled with glass. In another example, optical body 110 can include a glass border that can be filled with a gas, or a gas mixture, such as, for example, hydrogen, helium, oxygen, nitrogen, neon, argon, krypton, xenon, radon, air, and mixtures thereof.

In some embodiments, optical body 110 may be constructed of a material comprising a refractive index equal to or greater than about 1 (e.g., equal to or greater than about 1.1, equal to or great than about 1.2, equal to or greater than about 1.3, equal to or great than about 1.4, equal to or greater than about 1.5, equal to or great than about 1.6, equal to or greater than about 1.7, equal to or great than about 1.8, equal to or greater than about 1.9, equal to or great than about 2, equal to or greater than about 2.1, equal to or great than about 2.2, equal to or greater than about 2.3, equal to or great than about 2.4, equal to or greater than about 2.5, equal to or great than about 2.6, equal to or greater than about 2.7, equal to or great than about 2.8, equal to or greater than about 2.9, equal to or great than about 3, equal to or greater than about 3.1, equal to or great than about 3.2, or any value between, e.g., 1.000293 or 1.46). In some examples optical body 110 may include either as a solid structure or as a hollow structure materials such as glass, quartz, sapphire, polymer (e.g., polycarbonate), cubic zirconia, diamond, or combinations thereof.

In certain embodiments, optical body 110 may comprise a dielectric material such as, for example, ceramics, mica, glass, various metal oxides, and the like. When referring to optical body 110 with a hollow internal volume, various dielectric materials can be included to alter the refractive index of device 110, such as gases (e.g., nitrogen, helium, dry air, etc.) or dielectric liquids (e.g., distilled water, transformer oil, etc.).

In some examples, when optical body 110 is a solid (not hollow) structure, the dimension of the depth of optical body from first side 112 to second side 114 can be equal to or less than about 15 mm (1.5 cm) (e.g., equal to or less than about 14 mm, equal to or less than about 13 mm, equal to or less than about 12 mm, equal to or less than about 11 mm, equal to or less than about 10 mm, equal to or less than about 9 mm, equal to or less than about 8 mm, equal to or less than about 7 mm, equal to or less than about 6 mm, equal to or less than about 5 mm, equal to or less than about 4 mm, equal to or less than about 3 mm, equal to or less than about 2 mm, equal to or less than about 1 mm, equal to or less than about 0.9 mm, equal to or less than about 0.8 mm, equal to or less than about 0.7 mm, equal to or less than about 0.6 mm, equal to or less than about 0.5 mm, equal to or less than about 0.4 mm, equal to or less than about 0.3 mm, equal to or less than about 0.2 mm, equal to or less than about 0.1 mm, equal to or less than about 0.01 mm). When optical body 110 is a hollow structure, the thickness of the bordering surface can be equal to or less than about 1 mm (0.1 cm) (equal to or less than about 1 mm, equal to or less than about 0.9 mm, equal to or less than about 0.8 mm, equal to or less than about 0.7 mm, equal to or less than about 0.6 mm, equal to or less than about 0.5 mm, equal to or less than about 0.4 mm, equal to or less than about 0.3 mm, equal to or less than about 0.2 mm, equal to or less than about 0.1 mm, equal to or less than about 0.01 mm).

Referring back to FIGS. 1A-1C, device 100a can also include a receiver 120 positioned near first side 112 of optical body 110 and oriented towards second side 114. In some examples, receiver 120 can be a device capable of harvesting light energy and converting it into useful electricity. In some examples, receiver 120 can include a solar cell or photovoltaic cell. Suitable photovoltaic cells can include as a none-limiting example, microcrystalline silicon, polycrystalline silicon, gallium arsenide, multijunction cells (e.g., p-n junction), Perovskite cells, organic solar cells, dye-sensitized solar cells, quantum dots, and the like. Alternatively, or in addition thereto, receiver 120 can be capable of emitting light, as described in more detail in reference to FIGS. 9A-9C. As would be appreciated by one of skill in the relevant art, receiver 120 can be any sensor that can collect energy in a concentrated manner.

In any of the embodiments described herein, receiver 120 can be positioned on either surface of first side 112, such as the most-external surface or the surface within the internal volume of first side 112. Receiver 120 can be substantially within and/or parallel to a plane 160 of the first side. Although not shown in FIGS. 1A-1C, receiver 120 can be incorporated or built into first side 112. In some examples, receiver 120 can be smaller than first side 112 or equal to the size of first side 112. As would be appreciated by one of skill in the relevant art, as the photovoltaic cell field grows, the dimension of photovoltaic cells grows smaller and more efficient. In some embodiments, receiver 120 can include more than one photovoltaic cell positioned on first side 112 such that the efficiency of device 100 increases with the number of photovoltaic cells harvesting an increased amount of light energy.

Device 100 can further include a reflector 130 positioned on or near second side 114 of optical body 110. Shown more clearly in FIG. 1A, the cross-section of device 100a illustrates reflector 130 having substantially parabolic curves 130a, 130b extending along the length of second side 114 of optical body 110 and converging at a central point 133 on central axis 115. Each substantially parabolic curve 130a, 130b can be symmetric about a respective internal axis 135a, 135b of the parabolic curve. The at least two substantially parabolic curves 130a, 130b converge at a central point 133 which falls along the central axis 115. When looking at device 100 from a cross-sectional perspective, at least two parabolic curves 130a, 130b are formed when converging at central point 133 at the central axis, but additional parabolic curves converging at additional convergence points (not at the central axis) along second side 114 are contemplated. For instance, a cross-section of second side 114 of optical body 110 can have a three or more parabolic curves that are equally distributed along the length of second side 114. Each parabolic curve can be symmetric about its respective internal axis 135, as demonstrated in FIG. 1A. Alternatively, or in addition thereto, second side 114 can include a plurality of angled faces, as described in more detail in reference to FIG. 2C.

As shown more clearly in FIG. 1A, second side 114 can be substantially parallel to first side 112 such that a gap between second side 114 of optical body 110 and reflector 130 forms. When a gap is formed, the gap can include a different material than optical body 110. Alternatively, second side 114 can be curved to form the parabolic curves such that reflector 130 can be coated onto second side 114 with one or more reflective materials, such as, for example, silver, aluminum, gold, nickel, copper, magnesium fluoride, silicon dioxide, tantalum pentoxide, zinc sulfide, titanium dioxide, glass, sapphire, polymer, or combinations thereof. Notably, combinations of these materials may form a Bragg mirror, also known as a dielectric mirror. In some examples, reflector 130 may be optically bonded to second side 114 as necessary to facilitate concentration of light within optical body 110 as described herein.

As shown in FIGS. 1D and 1E, a peripheral edge 132 can form where optical body 110 converges with second side 114 and reflector 130. Peripheral edge 132 can join optical body 110 and second side 114 and/or reflector 130 with a rounded edge or a sharp joint. This rounding can be configured based on material or end-user requirements to facilitate manufacturing, mounting, or otherwise implementing the device.

Figure 2B:
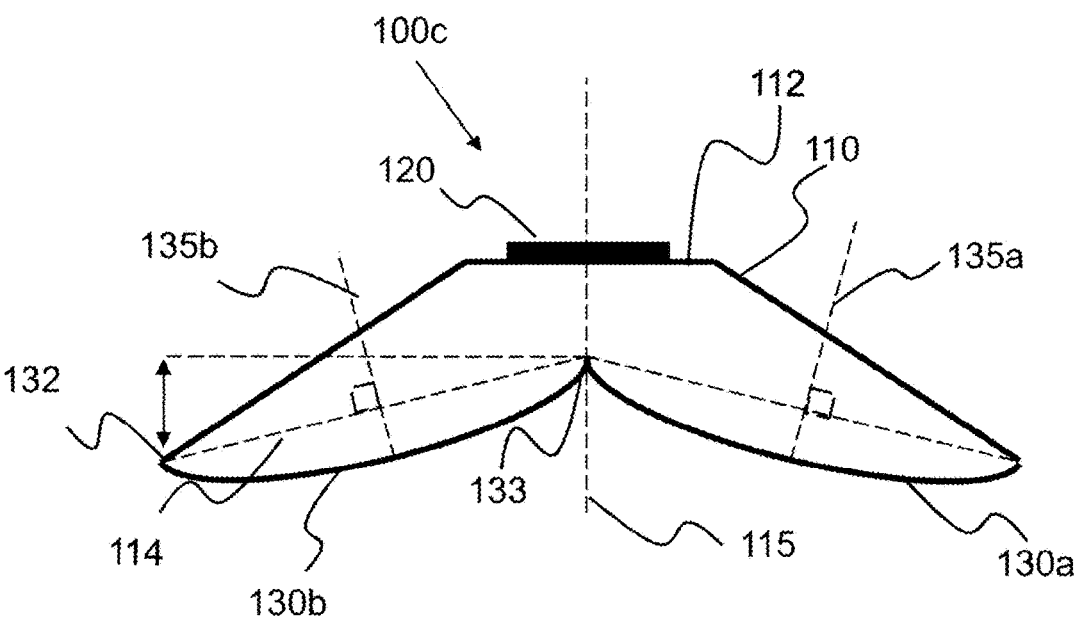
FIG. 2B provides a cross-sectional view of a device for concentrating light, in accordance with an exemplary embodiment of the present invention.

As would be understood by one of skill in the relevant art, various edges and surfaces of device 100 may be rounded, polished, or otherwise finished in accordance with the teachings of the art. As shown in FIG. 1A, peripheral edge 132 can be approximately uniform height with respect to central point 133 such that each internal axis 135a, 135b of each respective parabolic curve 130a, 130b is parallel to the central axis. Alternatively, FIG. 2A demonstrates a device 100b having a peripheral edge 132 being offset and positioned above central point 133 such that each internal axis 135a, 135b of each respective parabolic curve 130a, 130b is not parallel to central axis 115, but is instead directed towards first side 112 of optical body and/or receiver 120. In yet another variation, FIG. 2B demonstrates a device 100c having a peripheral edge 132 being offset and positioned below central point 133 such that each internal axis 135a, 135b of each respective parabolic curve 130a, 130b is not parallel to central axis 115, but is instead directed away from first side 112 of optical body and/or receiver 120.

Figure 2C:
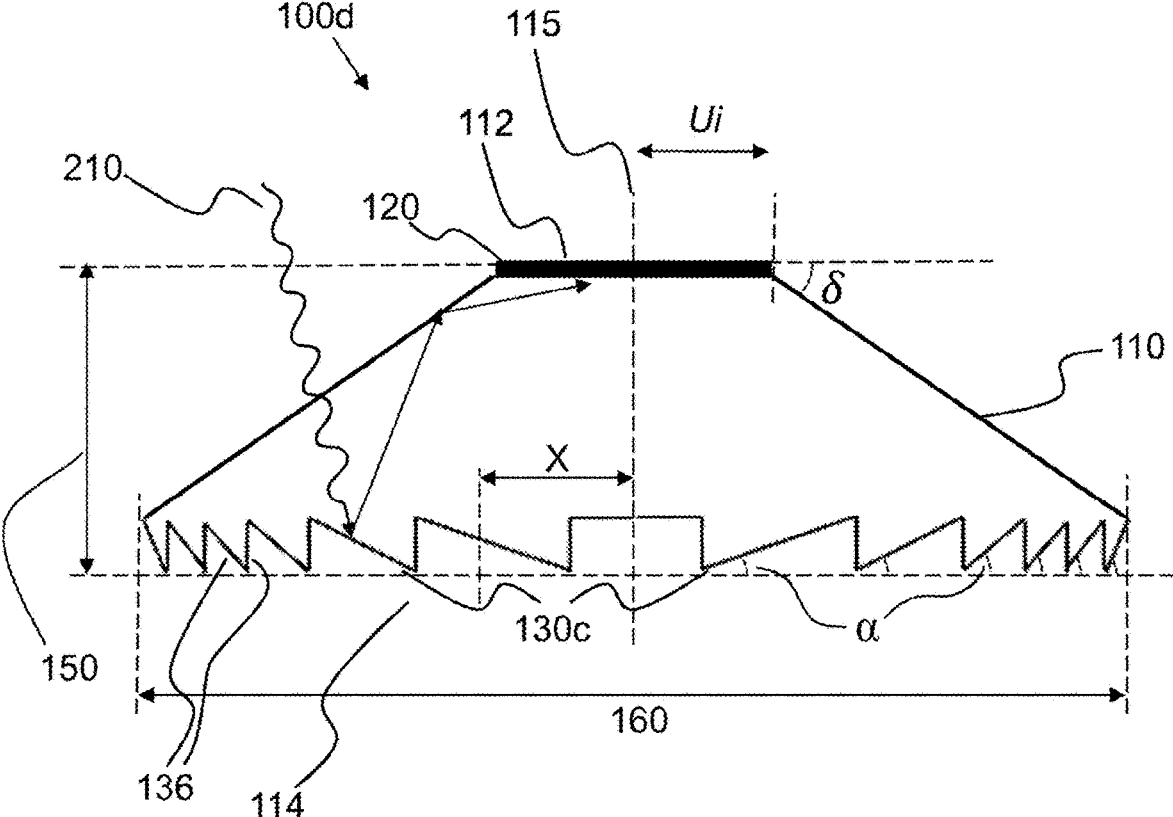
FIG. 2C provides a cross-sectional view of a device for concentrating light, in accordance with an exemplary embodiment of the present invention.

FIG. 2C provides an exemplary embodiment of a device 100d with second side 114 having a Fresnel reflector 130c. The Fresnel reflector 130c can be configured to reflect light toward the photovoltaic cell 120 in a similar manner as reflector 130. The Fresnel reflector 130c can be formed by coating second side 114 with a reflective material as described supra. In addition, second side 114 and/or Fresnel reflector 130c can include a plurality of angled faces 136. Each angled face 136 can be tilted at an angle α that satisfies the equation:

$$\alpha = 90^\circ + \sin^{-1}\left(\frac{1}{n}(\delta - \theta)\right) - \left[\delta + \tan^{-1}\left(\frac{A}{\frac{1}{G} + \frac{X}{Ui}}\right)\right],$$

where δ is an angle with respect to a plane of the first side to the optical body, n is a refractive index of the optical body, θ is an acceptance half-angle, A is an aspect ratio of the optical body equal to a length of the optical body 150 from the first side to the second side and divided by a width 160 of the second side of the optical body, G is a geometric gain of the optical body equal to the width of the first side of the optical body divided by the width of the second side of the optical body, Ui is half the width of the first side of the optical body, and X is a distance from the central axis to a center of each respective angled face.

Notably, offsetting of peripheral edge 132 and/or movement of central point 133 generates a tilt of each parabolic curve which can significantly impact the optical tolerance of device 100. In some embodiments, the tilt can be adjusted by an angle with respect to central axis 115. The angle of tilt can be satisfied by the following equation:

$$\beta = \delta - \sin^{-1}\left(\frac{1}{n}\sin(\delta - \theta)\right),$$

where $\beta$ is the angle, $\delta$ is an angle with respect to a plane of the first side to the optical body, n is a refractive index of the optical element, and $\theta$ is an acceptance half-angle. FIG. 2D illustrates variables used in determining an optimal angle of tilt for each respective parabolic curve. In particular, $\Theta$ is the acceptance half-angle, the point $(u_i, -y_0)$ represents the edge of the second side, and $\delta$ is an angle with respect to a plane 160 of the first side to the optical body. In this figure, the plane of the of the first side lies parallel to the X-axis. The dotted lines 1 and 2 show two example paths of light rays being reflected from the reflector to the receiver. The distance from the origin to $U_o$ represents half the width of the first side. t represents the distance from the first side to the second side.

FIG. 2E provides an example concentrator in the prior art which includes a single parabolic curve. Optical concentration is limited when using a single parabolic curve for reflecting the incident light to the receiver due to a fundamental limitation with the angle of tilt.

Figures 3A, 3B, 3C:
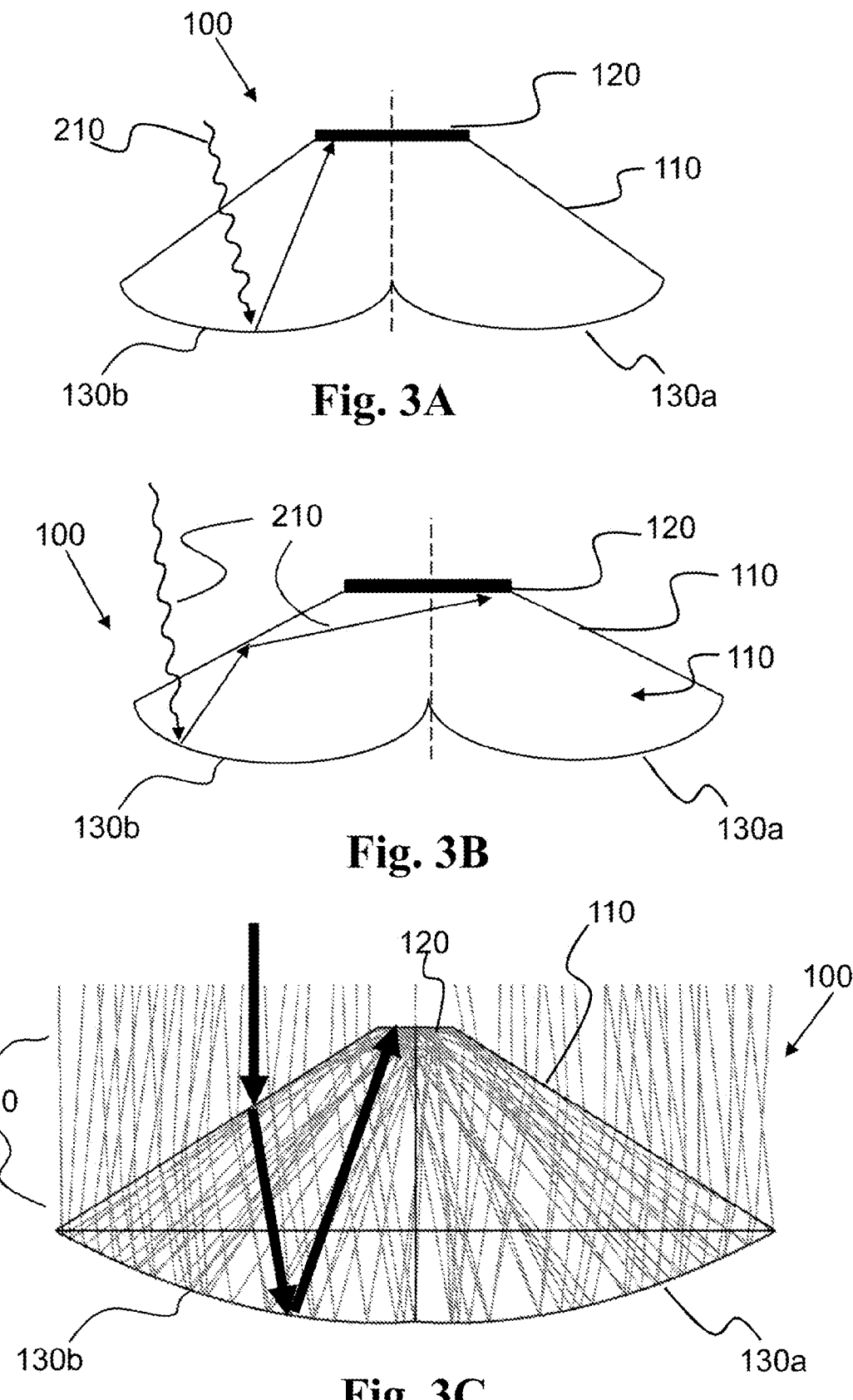
FIGS. 3A through 3C provide cross-sectional views of a device for concentrating light and light rays concentrated thereby, in accordance with an exemplary embodiment of the present invention.

FIGS. 3A and 3B show simplified schematics of a path of an incident light ray 210 that may interact with device 100 to be concentrated at receiver 120. As shown, light ray 210 may first enter the optical body 110 and reflect or bounce off reflector 130 to the receiver 120 in a single reflectance as illustrated in FIG. 3A, or in multiple iterations of reflection between reflector 130 and a boundary of optical body 110, known as total internal reflection, as demonstrated in FIG. 3B. FIG. 3C shows a schematic of various paths which a number of light rays 210 may follow upon entry into and reflection within optical body 110 under total internal reflectance.

FIG. 4 provides a flow chart of an example method 400 of using device 100 to concentrate light. Method 400 can include exposing 410 the device comprising a reflector and an optical body to incident light rays such that the light rays enter the optical body and reflect off the reflector, wherein the reflector comprises a curved surface comprising a cross section about a central axis of the device comprising at least two substantially parabolic curves. Method 400 can further include reflecting 420 the light rays within the optical body via total internal reflection until at least a portion of the light rays are collected at the receiver. Once light rays are within the optical body, method 400 can further include collecting 430 the reflected light rays at a receiver positioned on an opposing side of the optical body from the reflector.

Figure 5:
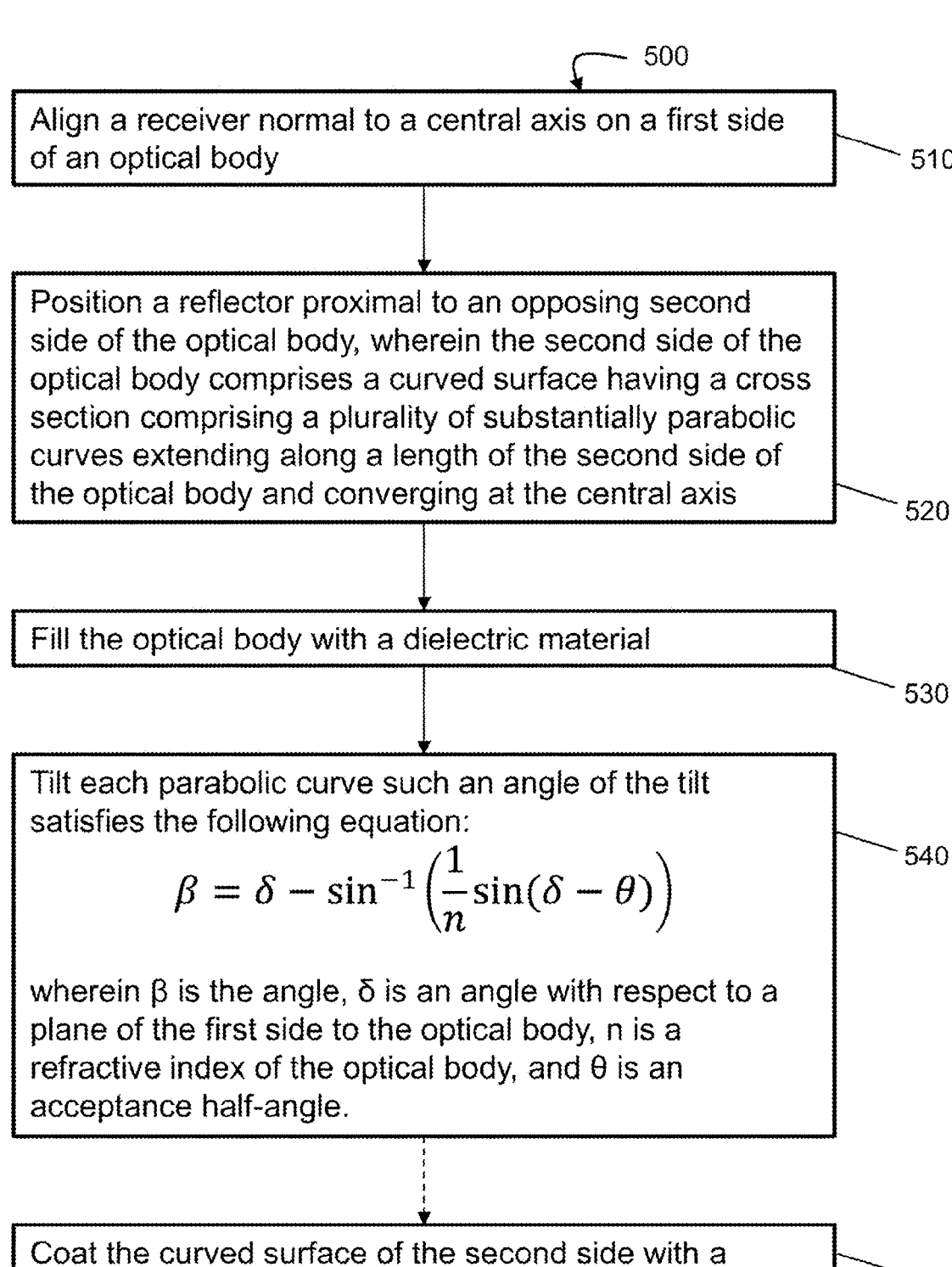
FIG. 5 provides a flow chart of a method of making a device for concentrating light, in accordance with an exemplary embodiment of the present invention.

FIG. 5 provides a flow chart of an example method 500 of making device 100 to concentrate light. Method 500 can include aligning 510 a receiver normal to a central axis on a first side of an optical body. Method 500 can further include positioning 520 a reflector proximal to an opposing second side of the optical body, wherein the second side of the optical body comprises a curved surface having a cross section comprising a plurality of substantially parabolic curves extending along a length of the second side of the optical body and converging at the central axis. Method 500 can optionally include filling 530 the optical body with a dielectric material. In addition, method 500 can include tilting 540 each parabolic curve such an angle of the tilt satisfies the following equation:

$$\beta = \delta - \sin^{-1}\left(\frac{1}{n}\sin(\delta - \theta)\right)$$

wherein $\beta$ is the angle, $\delta$ is an angle with respect to a plane 160 of the first side to the optical body, n is a refractive index of the optical body, and $\theta$ is an acceptance half-angle. Method 500 can also optionally include coating 550 the second side with a reflective material or reflective materials described herein.

Figure 6A:
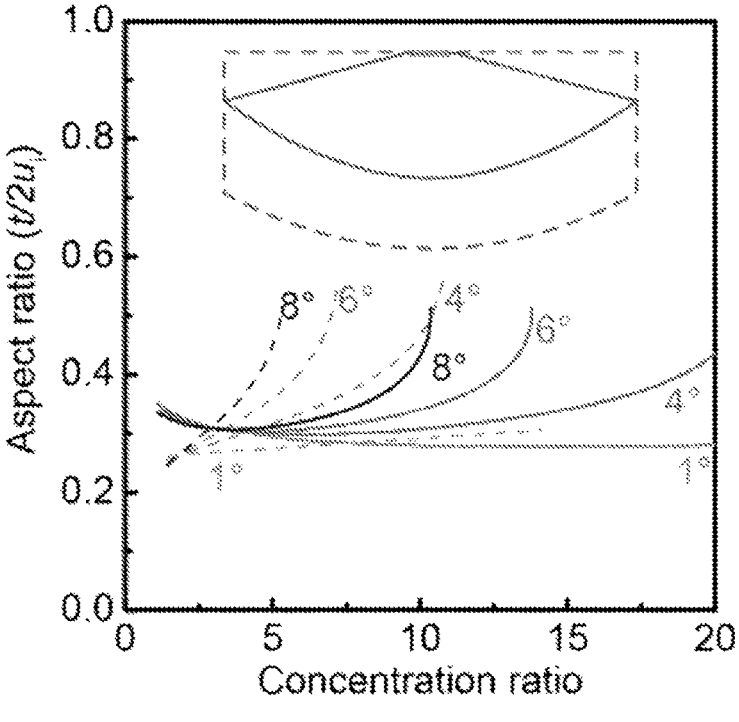
FIG. 6A provides a plot of the concentration ratio versus the aspect ratio at various acceptance half-angles in a device for concentrating light, in accordance with an exemplary embodiment of the present invention.

The plot of FIG. 6A serves to compare the concentration ratio to aspect ratio (AR) at various acceptance half-angles for both the current concentrator as well as a parabolic concentrator known in the art. In general, the aspect ratio is equal to the total depth relative to the width of the full entry aperture. The solid lines labeled 1°, 4°, 6°, and 8° represent the concentration ratio at various aspect ratios for an exemplary embodiment of present invention for various acceptance half-angles, namely 1°, 4°, 6°, and 8°. The dashed lines labeled 1°, 4°, 6°, and 8° represent the concentration ratio at various aspect ratios for a parabolic concentrator according to the prior art for various acceptance half-angles, namely 1°, 4°, 6°, and 8°. As could be appreciated by one of skill in the art, the device described herein can achieve greater concentration ratios at lower aspect ratios as compared to the parabolic concentrator according to the prior art shown in FIG. 2E.

Figure 6B:
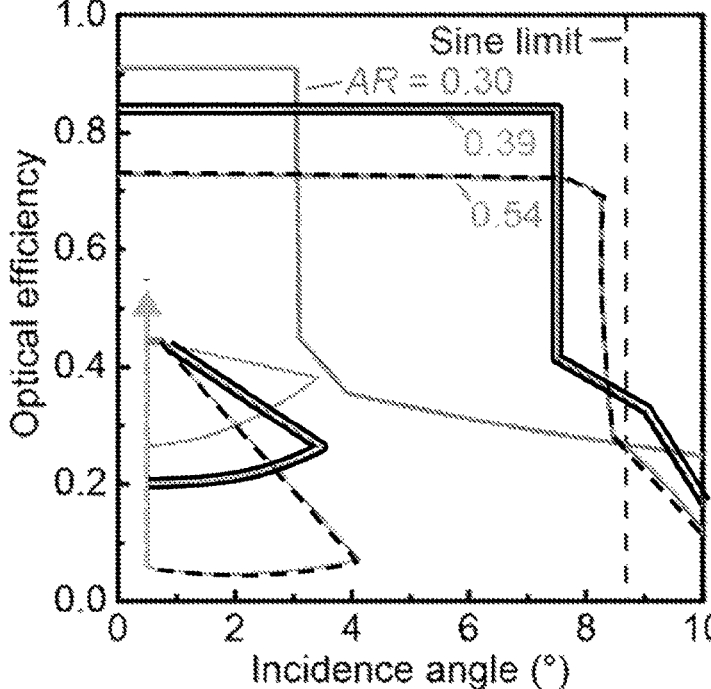
FIG. 6B provides a plot of the incidence angle versus the optical efficiency in a device for concentrating light, in accordance with an exemplary embodiment of the present invention.

The plot of FIG. 6B serves to compare the incidence angle of light with the optical efficiency of an exemplary concentrator. As shown, three lines representing three representative aspect ratios (AR), namely 0.30, 0.39, 0.54. In some embodiments, a smaller aspect ratio produces great optical efficiency. As used herein, the optical efficiency is the fraction of light incident on the concentrator that is delivered to the solar cell, whereas the power conversion efficiency is the ratio of the electrical power generated by the solar cell to the optical power incident on the concentrator. As shown, device 100 is capable of achieving an optical efficiency of at least 37% but can achieve higher optical efficiencies with varying aspect ratios (e.g., up to about 40% optical efficiency, up to about 45% optical efficiency, up to about 50% optical efficiency, up to about 55% optical efficiency, up to about 60% optical efficiency, up to about 65% optical efficiency, up to about 70% optical efficiency, up to about 75% optical efficiency, up to about 80% optical efficiency, up to about 85% optical efficiency, up to about 90% optical efficiency, up to about 95% optical efficiency, and any percentage point in between, e.g., up to about 43% or about 84% optical efficiency).

Figure 7A:
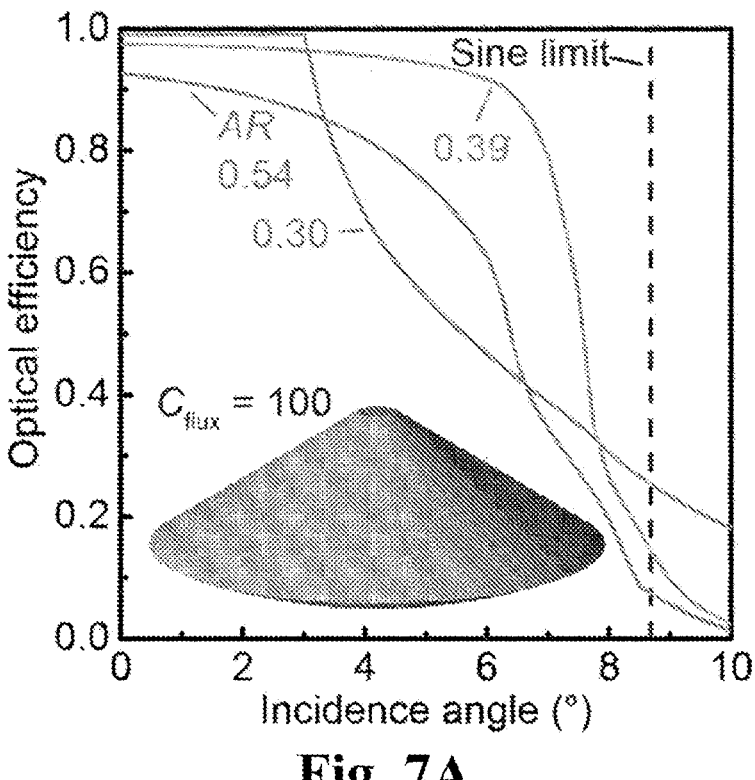
FIG. 7A provides a plot of the incidence angle versus the optical efficiency in a device for concentrating light, in accordance with an exemplary embodiment of the present invention.

FIG. 7A provides a plot comparing the incidence angle of light with the optical efficiency of an exemplary device of the present disclosure. The plot shows three lines representing three representative aspect ratios (AR), namely 0.30, 0.39, 0.54. As shown, a smaller aspect ratio produces great optical efficiency. As used herein, the optical efficiency is the fraction of light incident on the concentrator that is delivered to the solar cell, whereas the power conversion efficiency is the ratio of the electrical power generated by the solar cell to the optical power incident on the concentrator. As shown, device 100 is capable of achieving an optical efficiency of at least 37% but can achieve higher optical efficiencies with varying aspect ratios (e.g., up to about 40% optical efficiency, up to about 45% optical efficiency, up to about 50% optical efficiency, up to about 55% optical efficiency, up to about 60% optical efficiency, up to about 65% optical efficiency, up to about 70% optical efficiency, up to about 75% optical efficiency, up to about 80% optical efficiency, up to about 85% optical efficiency, up to about 90% optical efficiency, up to about 95% optical efficiency, and any percentage point in between, e.g., up to about 43% or about 84% optical efficiency).

Figure 7B:
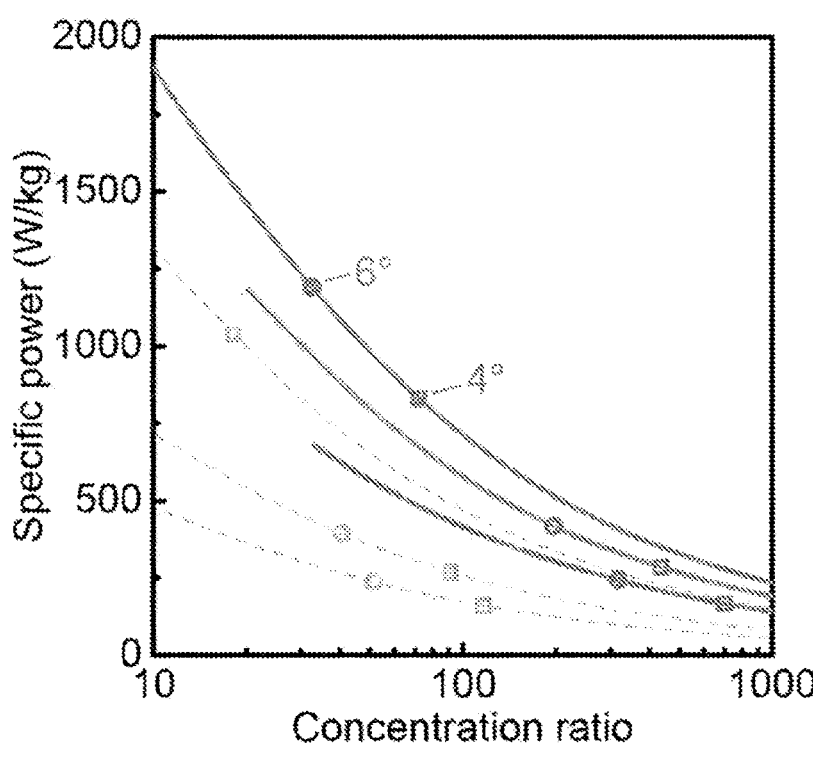
FIG. 7B provides a plot of the concentration ratio versus the specific power in a device for concentrating light, in accordance with an exemplary embodiment of the present invention.

FIG. 7B provides a plot comparing the concentration ratio of an exemplary embodiment of the concentrator with the specific power of an exemplary embodiment of the concentrator. The plot shows three lines representing three representative aspect ratios, namely 0.30, 0.39, 0.54. It can be seen that, within the appropriate ranges, higher specific powers at given concentration ratios can be achieved with an embodiment of the invention with a lower aspect ratio as compared to one with a higher aspect ratio.

Figure 8:
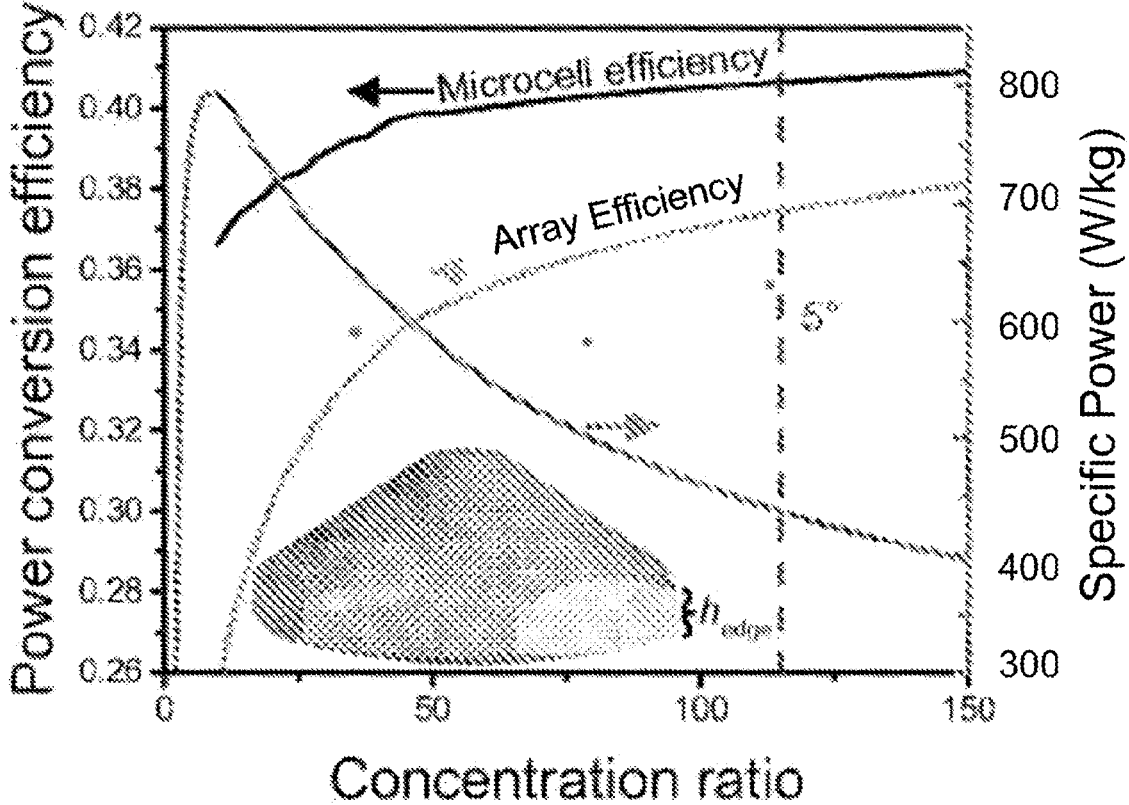
FIG. 8 provides a plot of the concentration ratio versus the power conversion efficiency in a device for concentrating light, in accordance with an exemplary embodiment of the present invention.

The plot of FIG. 8 provides a plot comparing the concentration ratio of an exemplary embodiment of the concentrator with the power conversion efficiency of an exemplary embodiment of the concentrator. As described above, the power conversion efficiency is the ratio of the electrical power generated by the solar cell to the optical power incident on the concentrator. As shown, at a concentration ratio greater than approximately 110 (to the right of the dashed line of FIG. 8), device 100 can be capable of achieving a power conversion efficiency of greater than 37% (e.g., a power conversion efficiency of at least 37%, of at least 40%, of at least 45%, of at least 50%, of at least 55%, of at least 60%, of at least 65%, of at least 70%, of at least 75%, and any power conversion efficiency percentage point in between, e.g., up to about 53%). As would be appreciated by one of skill in the art, next generation solar cells may become more efficient and capable of generating more electrical power. As such, it is anticipated that a combination of device 100 with state-of-the-art solar cells may further increase the power conversion efficiency beyond what is shown in FIG. 8.

Figures 9A, 9B, 9C:
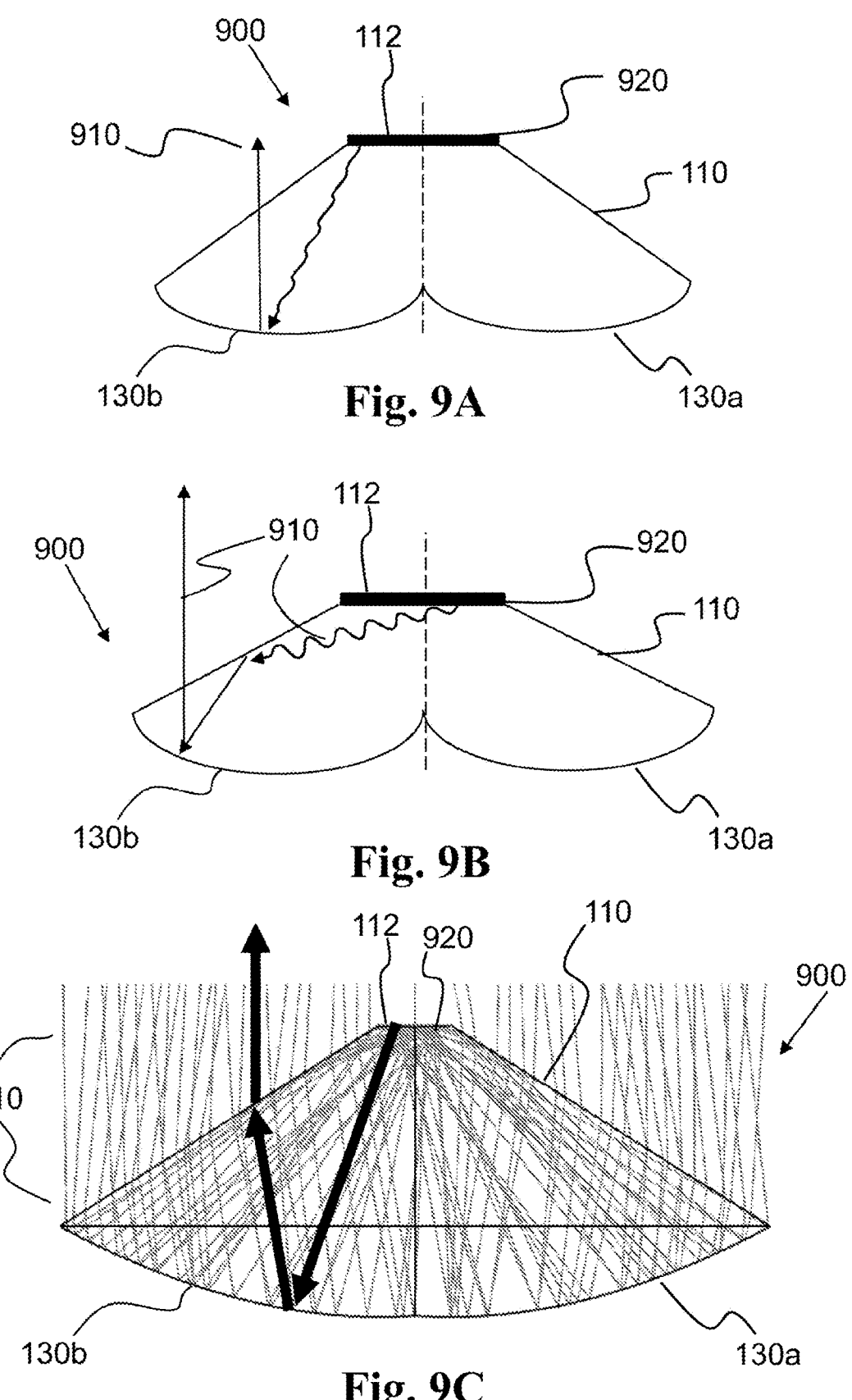
FIGS. 9A through 9C provide cross-sectional views of example devices for collimating light and light rays collimated thereby, in accordance with an exemplary embodiment of the present invention.

In some embodiments, using the same or similar materials and designs, device 100 can be altered such that receiver 120 is replaced with a light source 920 such that light energy can be reflected off of reflector 130a, 130b and collected into a single beam of light, such as a collimator 900, as shown in FIGS. 9A-9C. In some examples, light source 920 may be a light emitting diode (LED), a laser, an incandescent light bulb, a fluorescent light bulb, a neon light, and the like. As shown, a light ray 910 can be generated by the light source 920 and reflected by the reflector 130 prior to exiting optical body 110 in a direction substantially perpendicular to first side 112 of optical body 110.

In any of the embodiments herein, using the same or similar materials and designs, a device can include both a receiver 120 and a light source 920 such that a single device can alternate between concentrating light and emitting a collimated light. As would be appreciated by one of skill in the relevant art, the surface of a vehicle in space can be coated with hundreds or thousands of the devices described herein, without a significant increase in mass while improving optical concentration, angular tolerance and/or specific power for a wide range of angles.

The following examples further illustrate aspects of the present disclosure. However, they are in no way a limitation of the teachings or disclosure of the present disclosure as set forth herein.

EXAMPLES

Microcell concentrating photovoltaics (uCPV) can reduce the material cost and improve the performance of space photovoltaics in a simple and ultra-compact form factor. Because the efficiency enhancement and cost reduction both increase with the concentration ratio, it is of interest to identify high concentration ratio (CR), (CR>100) and low-mass concentrators. Space concentrators must also provide relatively high acceptance half-angles ($\theta \geq 5°$, where $\theta$ is the acceptance half-angle, to tolerate sun pointing errors, structural vibrations, and thermal distortions on the solar wing. This fundamentally constrains space concentrators to a different parameter space than their terrestrial counterparts as the maximum CR is proportional to $n^2/\sin^2(\theta)$, where n is the refractive index.

Monolithic and high specific power μCPV modules may be particularly advantageous in low-intensity, low-temperature (LILT) deep-space environments. Modern space multi-junction cells deliver ~31% efficiency at one-sun irradiance but struggle with shunt resistance and reduced fill factor losses in LILT conditions. Microcell concentrators can restore the solar intensity to one-sun or higher, bypassing detrimental LILT effects.

Here, a new glass-filled v-cone tailored edge-ray concentrator (V-TERC) is derived, modeled, and experimentally demonstrated for the first time. This work builds upon our previous research which surveyed available concentrator designs and found the simple parabolic reflector provided the best combination of optical efficiency, low-mass, and angular acceptance for space μCPV. However, the optimal concentration ratio for the parabolic reflector system is limited to below ~50 before the mass of the system outweighs the benefits of higher concentration and $\theta$ drops below 5°. The new V-TERC design more than doubles the achievable concentration ratio for a given $\theta$ over the parabolic reflector. Our results suggest a <1 mm thick V-TERC microconcentrator array is capable of providing >430 Watts per kilogram and 37% power conversion efficiency at CR>110 while maintaining $\theta$>5°. The high concentration, ultra-compact V-TERC could further increase the material cost and performance advantages of μCPV and enable solar powered missions in LILT conditions.

FIG. 8 shows the geometric construction of the glass filled V-TERC. Filling with optic with a dielectric (glass) permits either boosting CR by a factor of $n^2$ at fixed $\theta$ or increasing optical tolerance $\sin(\theta)$ by a factor of n at fixed CR. The edge-ray principle states that if rays incident at the rim of the entrance aperture ($u_i$) at $\pm\theta$ are redirected to the edges of a receiver ($u_o$), then all rays between $\pm\theta$ will be collected on the receiver. Following this principle, the V-TERC operates by reflecting Ray 2 directly to the far edge of the downward facing receiver ($-u_o$,0). Ray 1 is redirected to the same point by total internal reflection off the v-cone formed by connecting the receiver edge ($u_o$,0) to the entrance aperture edge ($u_i$, $-y_o$). The entrance aperture position that allows for both Ray 1 and Ray 2 to be collected can be found by solving $$\theta' = \tan^{-1}\left[(u_i + u_o)/y_i\right] - \tan^{-1}\left[(u_i - u_o)/y_i\right] \qquad (1)$$

for the input aperture rim ordinate, $y_o$, where $$2\theta' = \sin^{-1}\left[\frac{1}{n}\sin(\delta + \theta)\right] - \sin^{-1}\left[\frac{1}{n}\sin(\delta - \theta)\right]$$

and $\delta = \tan^{-1}[y_i/(u_i - u_o)]$. The bottom reflector surface must reflect Ray 2 at any point along the input aperture to the far edge of the receiver. The solution for this surface is a parabola passing through $(u_i, -y_i)$, with focus at $(-u_o, 0)$, and tilted by an amount:

$$\beta = \delta - \sin^{-1}\left[\frac{1}{n}\sin(\delta - \theta)\right],$$

The 3D concentrator is formed by an axisymmetric rotation of the shaded, dielectric filled region around the y-axis.

Compactness and aspect ratio of the system are described by the ratio of the maximum thickness t to entrance aperture diameter $2u_i$. FIG. 9A plots the aspect ratio of V-TERC and parabolic concentrators for $\theta = 4°$ and $\theta = 6°$. The V-TERC designs' aspect ratio is lower (more compact) except at low concentration (CR<20) and can be designed to much higher concentration ratios. However, unlike the parabolic concentrator, the V-TERC radiant intensity concentration ratio is lower than the geometric concentration ratio (G) ($G \equiv [u_i/u_o]^2$) due to the solid-angle transformation upon refraction through the v-cone. With an ideal backside reflector, the V-TERC approaches the sine limit at small acceptance angles. In practice with the parabolic reflector, ray rejection losses increase as designs approach the sine-limit, limiting the 3D V-TERC to operating at CR below approximately 60% the sine limit. In contrast, the paraboloid reaches just 25%.

To assess the specific power and power conversion efficiency, a hexagonal tiled V-TERC array was simulated, fully accounting for material absorption, dispersion, Fresnel reflection losses, and manufacturing constraints. Cell temperature is constant in the model. Truncating the axisymmetric concentrator into a hexagon introduces a minimum edge thickness ($h_{edge}$) at the vertices, which must be some minimum value to survive the glass molding process. Tooling limitations also impose a cusp loss between adjacent units. FIG. 11 estimates array and cell level power conversion efficiencies (PCE) and specific power, assuming a n=1.5 glass optic (with a density equal to 2.52 grams per cubic centimeter), $h_{edge}$=50 μm, cusp width=75 μm, and a state-of-the-art triple junction 170 μm square cell under the extraterrestrial spectrum (AM0). Only the mass of the optic is considered in this calculation, the mass of the microcell, interconnects, and coatings are assumed to be negligible. Microcell efficiency benefits from the intensity dependent increase in open-circuit voltage while array PCE also accounts for the optical efficiency which increases monotonically with CR due to decreasing losses from cusp regions and cell shading. The peak in specific power at CR≈10 results from the trade-off between increasing optical efficiency and increasing mass of the system with CR. The area density increases with concentration ratio as the designs become thicker, but the V-TERC still provides high specific power (>400 Watts per kilogram) up to nearly CR=150. The acceptance half-angle is greater than 5° for all designs under CR=115. At CR=115, $\theta$=5° and overall PCE is 37%. Selecting the optimal design requires balancing the specific power, efficiency, angular acceptance, and cost reduction. Relying on a single performance metric could result in high specific power arrays with low power conversion efficiency, or highly efficient designs too heavy and restrictive ($\theta$<) 5° for space applications.

To experimentally validate the design, a proof-of-concept was constructed G=175 V-TERC prototype. The optic was diamond turned in glass (Schott B270), backside coated with a protected silver finish, and paired with a 650 μm square Gallium arsenide cell. Short-circuit current from the V-TERC system was measured under collimated broadband illumination from a supercontinuum laser as the angle of incidence was controllably varied between one and ten degrees. The on-axis current enhancement ratio was measured at 92, which is expected due to Fresnel reflection losses at the uncoated microcell substrate and V-TERC glass-air interfaces. The experimental results agree well with the model but highlight the need to tighten tolerances and reduce reflection losses in future prototype systems. The more severe angular roll-off of the prototype V-TERC is attributed to the output aperture diameter being oversized by 240 μm.

Microcell concentrators are distinguished from previous space CPV systems because they are ultra-thin, monolithic, and use radiation-hard materials. The V-TERC design introduced here expands on these advantages by opening up the high concentration regime to further boost cell efficiency and reduce material cost. If a V-TERC array were manufactured it seems likely it could compete with conventional coverglass interconnected cells (CICs) on specific power and outperform on absolute efficiency. In LILT conditions, the high-concentration V-TERC could be particularly beneficial. At Jupiter and Saturn, the solar flux decreases by ~25× and ~100× respectively. Conventional cells can struggle with shunt-current and fill-factor reduction LILT effects at these low solar intensities and must be optimized and carefully screened. A V-TERC system could restore the solar intensity to one sun or higher, improve efficiency, potentially eliminate expensive screening measures, and enable solar-powered spacecraft beyond the range of conventional CICs.

The potential cell material cost savings of μCPV are significant. A state-of-the-art 4" wafer yields two 27 cm² CICs. At 31% efficiency, these two cells provide ~2.3 W under AM0. The same wafer fabricated for 170 μm square microcells will result in over 230,000 microcells. In a CR=115 V-TERC array, these cells could yield more than 370 W. Additionally, μCPV arrays are not restricted to the conventional 27 cm² rectangular form factor and could be patterned to improve packing efficiency on the solar wing.

In some examples, aligning the top v-cone array and bottom reflector array requires additional precision in the glass molding procedure, and the non-planar front surface complicates cell placement and interconnection. Cell heating may be passively handled as the microscale dimension of the cells can effectively dissipate heat. Radiation resistance could be enhanced by selectively depositing protection around the microcell. Because the cell occupies less than 1% of the array area the impact on the mass and shading would be minimal.

In conclusion, herein a new glass-filled v-cone tailored edge-ray microcell concentrator useful in space solar power is introduced. The design is detailed and a high concentration prototype demonstrates the concept for the first time. The design can operate at concentration ratios more than double that of past space CPV systems while retaining a large acceptance angle in a compact <1 mm thick package. These results lay the groundwork for high flux microconcentrators for space solar power that operate at competitive specific power (>400 Watts per kilogram) and high efficiency (>37%).

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way.

What is claimed is:

1. A device for concentrating light, the device comprising:
a substantially cone-shaped optical body comprising a first side, an opposing second side extending along a central axis, and a conical surface extending from the first side to the second side such that the second side is larger than the first side;
a receiver positioned near the first side of the optical body and oriented towards the second side, the receiver comprising a photovoltaic cell that is optically bonded to at least a portion of the first side of the optical body; and
a reflector proximate the second side of the optical body, wherein a cross section of the reflector about the central axis comprises at least two substantially parabolic curves extending along a length of the second side of the optical body and converging at the central axis;
wherein the at least two substantially parabolic curves are oriented relative to the conical surface and the central axis such that incident light within an acceptance half angle of the central axis is refracted through the conical surface and reflected by at least the reflector to the receiver.

2. The device of claim 1, wherein the second side of the optical body comprises a curved surface.

3. The device of claim 1, wherein the reflector comprises a first parabolic curve and a second parabolic curve, and wherein each respective parabolic curve of the reflector is symmetric about a respective internal axis.

4. The device of claim 3, wherein a peripheral edge of the respective parabolic curve of the reflector is positioned at an approximately uniform height from a central point of the parabolic curve such that the internal axis of each respective parabolic curve of the reflector is parallel to the central axis.

5. The device of claim 3, wherein a peripheral edge of the respective parabolic curve of the reflector is positioned at an increased height from a central point of the parabolic curve such that the internal axis of each respective parabolic curve of the reflector is directed towards the receiver.

6. The device of claim 3, wherein a peripheral edge of the respective parabolic curve of the reflector is positioned at a decreased height from a central point of the parabolic curve such that the internal axis of each respective parabolic curve of the reflector is directed away from the receiver.

7. The device of claim 3, wherein each parabolic curve is tilted by an angle with respect to the central axis that satisfies the following equation:

$$\beta = \delta - \sin^{-1}\left(\frac{1}{n}\sin(\delta - \theta)\right),$$

wherein $\beta$ is the angle with respect to the central axis, $\delta$ is an angle with respect to a plane of the first side to the optical body, n is a refractive index of the optical body, and $\theta$ is the acceptance half-angle.

8. The device of claim 1, wherein the optical body is constructed of a material comprising a refractive index equal to or greater than about 1.3.

9. The device of claim 1, wherein the optical body comprises a dimension from the first side to the second side equal to or less than 1 cm.

10. The device of claim 1, wherein the device is configured to achieve an optical efficiency of at least 37%.

11. The device of claim 7, wherein the device is configured to achieve at least 37% power conversion efficiency with a concentration ratio greater than approximately 110 and the acceptance half-angle greater than approximately 5 degrees.

12. The device of claim 7, wherein the device is configured to decrease light rejection losses by at least 35% compared to a comparative device having a reflector comprising only one parabolic curve.

13. A device for concentrating light, the device comprising:
an optical element comprising a first side, an opposing second side, and a conical surface extending from the first side to the second side defining an internal volume of the optical element;
a photovoltaic cell positioned on the first side of the optical element; and
a reflector positioned on the second side of the optical element;
wherein the optical element is configured to refract light entering the internal volume through the conical surface, and
wherein the reflector comprises two curved surfaces, each respective curved surface extending along a length of the second side of the optical element and converging at a central axis of the device such that the refracted light focuses on the photovoltaic cell.

14. The device of claim 13, wherein the two curved surfaces of the reflector are tilted by an angle with respect to the central axis in such a way that the reflector reflects the focused light to the photovoltaic cell, and wherein the angle of tilt satisfies the following equation:

$$\beta = \delta - \sin^{-1}\left(\frac{1}{n}\sin(\delta - \theta)\right),$$

21

22 wherein β is the angle, δ is an angle with respect to a plane of the first side to the optical body, n is a refractive index of the optical element, and θ is an acceptance half-angle.

15. A method of concentrating light, the method comprising:

exposing a device comprising a reflector and an optical body having a conical surface to incident light rays such that the light rays enter the optical body through the conical surface and reflect off the reflector, wherein the reflector comprises a curved surface comprising a cross section about a central axis of the device comprising at least two substantially parabolic curves; and collecting the reflected light rays at a receiver positioned on an opposing side of the optical body from the reflector, wherein the receiver is a photovoltaic cell and covers at least a portion of a first side of the optical body.

16. The method of any of claims 15, wherein the two curves of the reflector are tilted by an angle with respect to the central axis in such a way that the reflector reflects the light rays to the receiver, and wherein the angle of tilt satisfies the following equation:

$$\beta = \delta - \sin^{-1}\left(\frac{1}{n}\sin(\delta - \theta)\right),$$

wherein β is the angle, δ is an angle with respect to a plane of the first side to the optical body, n is a refractive index of the optical body, and θ is an acceptance half-angle; and wherein the light rays in the optical body are subject to total internal reflection.

17. A method of making a device for concentrating light, the method comprising:

aligning a receiver normal to a central axis on a first side of an optical body;

positioning a reflector proximal to an opposing second side of the optical body, wherein the second side of the optical body comprises a curved surface having a cross section comprising a plurality of substantially parabolic curves extending along a length of the second side of the optical body and converging at the central axis, wherein optical body comprises a conical surface extending from the first side to the second side such that the second side is larger than the first side and wherein the plurality of substantially parabolic curves are oriented relative to the conical surface and the central axis such that incident light within an acceptance half angle of the central axis is refracted through the conical surface and reflected by at least the reflector to the receiver.

18. The method of claim 17, further comprising filling the optical body with a dielectric material.

19. The method of claim 17, wherein the curved surface of the optical body comprises a first parabolic curve and a second parabolic curve, and wherein each respective parabolic curve is symmetric about a respective internal axis.

20. The method of claim 19, further comprising tilting each parabolic curve at an angle that satisfies the following equation:

$$\beta = \delta - \sin^{-1}\left(\frac{1}{n}\sin(\delta - \theta)\right),$$

wherein β is the angle, δ is an angle with respect to a plane of the first side to the optical body, n is a refractive index of the optical body, and θ is an acceptance half-angle.

21. A device for concentrating light, the device comprising:

a substantially cone-shaped optical body comprising a first side, an opposing second side extending along a central axis, and a conical surface extending from the first side to the second side such that the second side is larger than the first side;

a photovoltaic cell positioned near the first side of the optical body and oriented towards the second side; and a Fresnel reflector proximate the second side of the optical body, wherein the Fresnel reflector is configured to reflect light, such that incident light within an acceptance half angle of the central axis is refracted through the conical surface and reflected by the Fresnel reflector towards the photovoltaic cell.

22. The device of claim 21, wherein the Fresnel reflector is formed by coating a surface of the second side with a reflective material; and wherein the surface of the second side comprises a plurality of angled faces.

23. The device of claim 22, wherein each of the plurality of angled faces is tilted by an angle with respect to the central axis that satisfies the following equation:

$$\alpha = 90° + \sin^{-1}\left(\frac{1}{n}(\delta - \theta)\right) - \left[\delta + \tan^{-1}\left(\frac{A}{\frac{1}{G} + \frac{X}{Ui}}\right)\right]$$

wherein α is the tilt angle, δ is an angle with respect to a plane of the first side to the optical body, n is a refractive index of the optical body, θ is the acceptance half-angle, A is an aspect ratio of the optical body equal to a length of the optical body from the first side to the second side and divided by a width of the second side of the optical body, G is a geometric gain of the optical body equal to the width of the first side of the optical body divided by the width of the second side of the optical body, Ui is half the width of the first side of the optical body, and X is a distance from the central axis to a center of each respective angled face.

* * * * *